United States Patent
Cho

(10) Patent No.: US 12,464,705 B2
(45) Date of Patent: Nov. 4, 2025

(54) SEMICONDUCTOR DEVICE HAVING A LATERAL CONDUCTIVE LINE INCLUDED LOW AND HIGH WORK FUNCTION ELECTRODES

(71) Applicant: SK hynix Inc., Gyeonggi-do (KR)

(72) Inventor: Jin Sun Cho, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 455 days.

(21) Appl. No.: 17/988,071

(22) Filed: Nov. 16, 2022

(65) Prior Publication Data

US 2023/0397403 A1 Dec. 7, 2023

(30) Foreign Application Priority Data

Jun. 2, 2022 (KR) .................. 10-2022-0067332

(51) Int. Cl.
H10B 12/00 (2023.01)
(52) U.S. Cl.
CPC ........... *H10B 12/312* (2023.02); *H10B 12/03* (2023.02); *H10B 12/482* (2023.02)
(58) Field of Classification Search
CPC ........ H10B 12/03; H10B 12/05; H10B 12/30; H10B 12/312; H10B 12/48; H10B 12/482; H10B 12/488; H10B 30/673; H10B 30/6734

USPC ................................... 257/906, 908
See application file for complete search history.

(56) References Cited

U.S. PATENT DOCUMENTS

| | | | |
|---|---|---|---|
| 10,535,659 B2 | 1/2020 | Kim et al. | |
| 2021/0183862 A1 | 6/2021 | Son et al. | |
| 2023/0180455 A1* | 6/2023 | Choi ..................... | H10B 12/03 257/295 |

* cited by examiner

*Primary Examiner* — Hoai V Pham
(74) *Attorney, Agent, or Firm* — IP & T GROUP LLP

(57) ABSTRACT

A semiconductor device includes: a lateral layer spaced apart from a lower structure and extending in a direction parallel to the lower structure; a vertical conductive line extending in a direction perpendicular to the lower structure and coupled to a first-side end of the lateral layer; a data storage element coupled to a second-side end of the lateral layer; and a lateral conductive line extending in a direction crossing the lateral layer, wherein the lateral conductive line includes: a first work function electrode; a second work function electrode disposed adjacent to the vertical conductive line and having a lower work function than the first work function electrode; and a third work function electrode disposed adjacent to the data storage element and having a lower work function than the first work function electrode.

15 Claims, 15 Drawing Sheets

SEMICONDUCTOR DEVICE HAVING A LATERAL CONDUCTIVE LINE INCLUDED LOW AND HIGH WORK FUNCTION ELECTRODES

CROSS-REFERENCE TO RELATED APPLICATIONS

The present application claims priority of Korean Patent Application No. 10-2022-0067332, filed on Jun. 2, 2022, which is incorporated herein by reference in its entirety.

BACKGROUND

1. Field

Embodiments of the present invention relate to a semiconductor device including three-dimensional memory cells, and a method for fabricating the same.

2. Description of the Related Art

The size of a memory cell is being continuously reduced to increase the net die of a memory device. As the size of memory cells is miniaturized, it is required to reduce parasitic capacitance Cb and increase the capacitance as well. However, it is difficult to increase the net die due to the structural limitation of memory cells.

Recently, three-dimensional semiconductor memory devices including memory cells that are arranged in three dimensions are being considered.

SUMMARY

Embodiments of the present invention are directed to a semiconductor device including highly integrated memory cells, and a method for fabricating the semiconductor device.

In accordance with one embodiment of the present invention, a semiconductor device includes: a lateral layer spaced apart from a lower structure and extending in a direction parallel to the lower structure; a vertical conductive line extending in a direction perpendicular to the lower structure and coupled to a first-side end of the lateral layer; a data storage element coupled to a second-side end of the lateral layer; and a lateral conductive line extending in a direction crossing the lateral layer, wherein the lateral conductive line includes: a first work function electrode; a second work function electrode disposed adjacent to the vertical conductive line and having a lower work function than the first work function electrode; and a third work function electrode disposed adjacent to the data storage element and having a lower work function than the first work function electrode.

In accordance with another embodiment of the present invention, a method for fabricating a semiconductor device, includes: forming a stack body in which a dielectric layer, a first sacrificial layer, a semiconductor layer, and a second sacrificial layer are alternately stacked over a lower structure; forming a vertical opening by etching the stack body; forming lateral recesses by recessing the first sacrificial layer and the second sacrificial layer from the vertical opening; and forming a lateral conductive line including a combination of different work function electrodes in the lateral recesses; wherein the forming of the lateral conductive line includes: forming a first low work function electrode; forming a high work function electrode which is parallel to the first low work function electrode but having a higher work function than the first low work function electrode; and forming a second low work function electrode which is parallel to the high work function electrode but having a lower work function than the high work function electrode.

In accordance with yet another embodiment of the present invention, a semiconductor device includes: a semiconductor layer spaced apart from a lower structure and extending in a direction parallel to the lower structure; a vertical conductive line extending in a direction perpendicular to the substrate and coupled to a first-side end of the semiconductor layer; a data storage element coupled to a second-side end of the semiconductor layer; and a word line extending in a direction crossing the semiconductor layer, wherein the word line includes: a metal electrode; a first polysilicon electrode disposed adjacent to the vertical conductive line and having a lower work function than the metal electrode; and a second polysilicon electrode disposed adjacent to the data storage element and having a lower work function than the metal electrode.

In accordance with still another embodiment of the present invention, a semiconductor device includes: a lower structure; a three-dimensional array including a column array of transistors that are vertically stacked over the lower structure; a vertical conductive line vertically oriented over the lower structure and commonly coupled to a first side of each of the transistors of the three-dimensional array; and a data storage element coupled to a second side of each of the transistors of the three-dimensional array, wherein the transistors of each column array of the three-dimensional array includes: a lateral layer; and a lateral conductive line having a triple work function electrode structure that extends laterally in a direction crossing the lateral layer. The lateral conductive line of the triple work function electrode structure may include a first low work function electrode, a second low work function electrode, and a high work function electrode between the first low work function electrode and the second low work function electrode. In accordance with still another embodiment of the present invention, a semiconductor device includes: lower structure; a transistor disposed over the lower structure, the transistor including a lateral layer and a lateral word line crossing the lateral layer; a vertical bit line extending vertically from the lower structure and coupled to a first-side end of the lateral layer; and a data storage element coupled to a second-side end of the lateral layer, wherein the lateral word line includes: a first work function electrode disposed over the lateral layer; a second work function electrode having a lower work function than the first work function electrode and disposed adjacent the vertical bit line; and a third work function electrode disposed adjacent to the data storage element and having a lower work function than the first work function electrode.

DETAILED DESCRIPTION

Figure 1A:
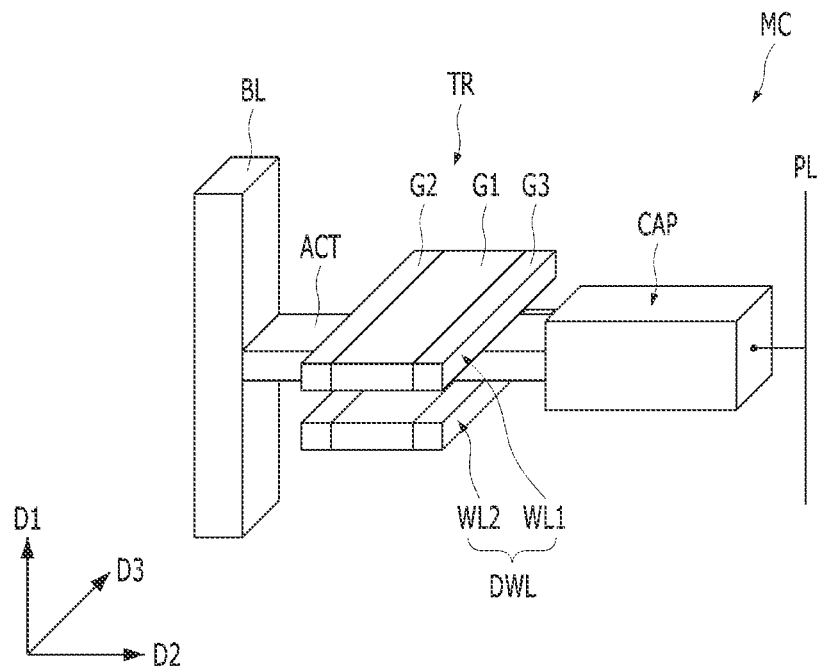
FIG. 1A is a schematic perspective view illustrating a memory cell in accordance with one embodiment of the present invention.

Embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

According to the following embodiments of the present invention, the density of memory cells may be increased and the parasitic capacitance may be reduced by vertically stacking memory cells.

The following embodiments of the present invention relate to a three-dimensional memory cell, in which a lateral conductive line (e.g., a word line or a gate electrode) may include a low work function electrode and a high work function electrode. The low work function electrode may be disposed adjacent to a data storage element (e.g., a capacitor) and a vertical conductive line (or a bit line), and the high work function electrode may overlap with a channel of a lateral layer.

With the low work function of the low work function electrode, a low electric field may be formed between the lateral conductive line and the data storage element, thereby reducing leakage current.

The high work function of the high work function electrode may not only form a high threshold voltage of a switching element, but also lower the height of the memory cell by forming a low electric field, which is advantageous in terms of high density device integration.

Figure 1B:
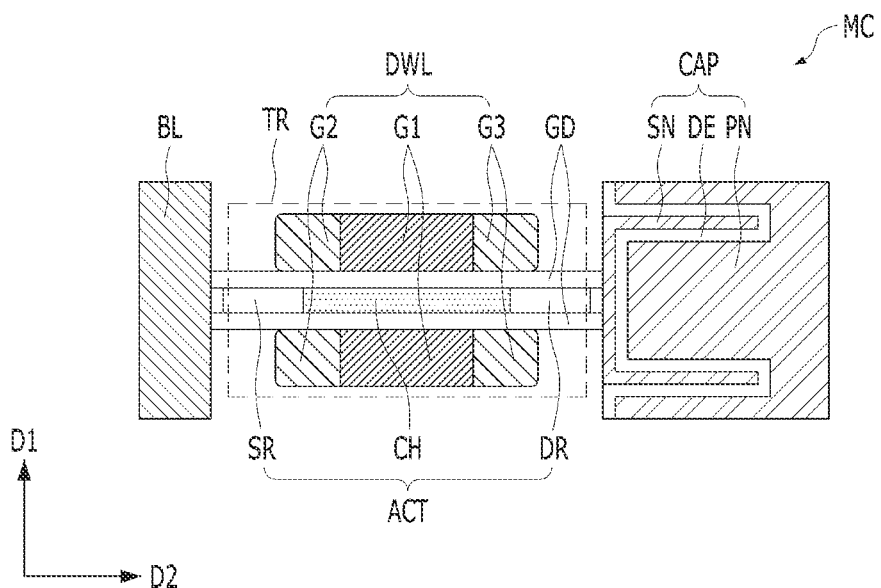
FIG. 1B is a schematic cross-sectional view illustrating the memory cell shown in FIG. 1A.
Figure 1C:
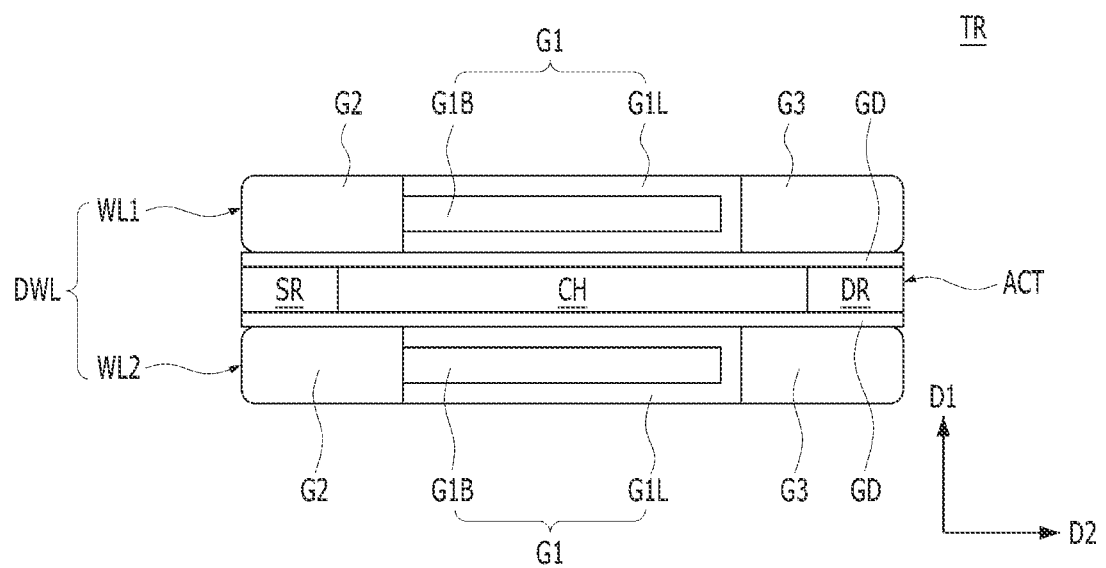
FIG. 1C is an enlarged view illustrating a switching element TR of a memory cell.

FIG. 1A is a schematic perspective view illustrating a memory cell in accordance with one embodiment of the present invention. FIG. 1B is a schematic cross-sectional view illustrating the memory cell shown in FIG. 1A. FIG. 1C is an enlarged view illustrating a switching element TR of the memory cell.

Referring to FIGS. 1A to 1C, the memory cell MC may include a vertical conductive line BL, a switching element TR, and a data storage element CAP. The switching element TR may include a lateral layer ACT, a gate dielectric layer GD, and a lateral conductive line DWL. The data storage element CAP may include a memory dement, such as a capacitor. The vertical conductive line BL may include a bit line. The lateral conductive line DWL may include a word line, and the lateral layer ACT may include an active layer. The data storage element CAP may include a first electrode SN, a dielectric layer DE, and a second electrode PN. The switching element TR may Include a transistor, and in this case, the lateral conductive line DWL may server as a gate electrode. The switching dement TR may also be referred to as an access element or a selection element.

The vertical conductive line BL may vertically extend in a first direction D1. The lateral layer ACT may extend in a second direction D2 intersecting with the first direction D1. The lateral conductive line DWL may extend in a third direction D3 intersecting with the first direction D1 and the second direction D2.

The vertical conductive line BL may be vertically oriented in the first direction D1. The vertical conductive line BL may be referred to as a vertically oriented bit line, vertically extended bit line, or a pillar-shape bit line. The vertical conductive line BL may include a conductive material. The vertical conductive line BL may include a silicon-based material, a metal-based material, or a combination thereof. The vertical conductive line BL may include polysilicon, a metal, a metal nitride, a metal silicide, or a combination thereof. The vertical conductive line BL may include polysilicon, titanium nitride, tungsten, or a combination thereof. For example, the vertical conductive line BL may include polysilicon or titanium nitride (TiN) which is doped with an N-type impurity. The vertical conductive line BL may include a TiN/W stack which includes titanium nitride and tungsten.

The switching element TR may include a transistor. Thus, the lateral conductive line DWL may be referred to as a lateral gate line or a lateral word line. In the lateral conductive line DWL, a first lateral conductive line WL1 and a second lateral conductive line WL2 may have the same potential. For example, the first lateral conductive line WL1 and the second lateral conductive line WL2 may form a pair, and may be coupled to one memory cell MC. The same driving voltage may be applied to the first lateral conductive line WL1 and the second lateral conductive line WL2.

The lateral conductive line DWL may extend in the third direction D3, and the lateral layer ACT may extend in the second direction D2. The lateral layer ACT may be laterally arranged in the second direction D2 from the vertical conductive line BL. The lateral conductive line DWL may have a double structure. For example, the lateral conductive line DWL may include a first lateral conductive line WL1 and a second lateral conductive line WL2 that are facing each other with the lateral layer ACT interposed therebetween. A gate dielectric layer GD may be formed on the upper and lower surfaces of the lateral layer ACT. The first lateral conductive line WL1 may be disposed in the upper portion of the lateral layer ACT, and the second lateral conductive line WL2 may be disposed in the lower portion of the lateral layer ACT. The lateral conductive line DWL may include a pair of a first lateral conductive line WL1 and a second lateral conductive line WL2.

The lateral layer ACT may extend in the second direction D2. The lateral layer ACT may include a semiconductor material. For example, the lateral layer ACT may include polysilicon, monocrystalline silicon, germanium, or silicon germanium. According to another embodiment of the present invention, the lateral layer ACT may include an oxide semiconductor material. For example, the oxide semiconductor material may include indium gallium zinc oxide (IGZO).

The upper and lower surfaces of the lateral layer ACT may have a flat surface. In other words, the upper surface and the lower surface of the lateral layer ACT may be parallel to each other in the second direction D2.

As shown in FIG. 1B, the lateral layer ACT may include a channel CH, a first doped region SR between the channel CH and a vertical conductive line BL, and a second doped region DR between the channel CH and a data storage element CAP. When the lateral layer ACT is of an oxide semiconductor material, the channel CH may be formed of an oxide semiconductor material, and the first doped region SR and the second doped region DR may be omitted. The lateral layer ACT may also be referred to as an active layer or a thin-body.

The first doped region SR and the second doped region DR may be doped with impurities of the same conductivity type. The first doped region SR and the second doped region DR may be doped with an N-type impurity or a P-type impurity. The first doped region SR and the second doped region DR may include at least one impurity selected among arsenic (As), phosphorus (P), boron (B), indium (In), and a combination thereof. The first doped region SR may be coupled to the vertical conductive line BL, and the second doped region DR may be coupled to the first electrode SN of the data storage element CAP.

The gate dielectric layer GD may include silicon oxide, silicon nitride, a metal oxide, a metal oxynitride, a metal silicate, a high-k material, a ferroelectric material, an anti-ferroelectric material or a combination thereof. The gate dielectric layer GD may include $SiO_2$, $Si_3N_4$, $HfO_2$, $Al_2O_3$, $ZrO_2$, AlON, HfON, HfSiO, HfSiON, or a combination thereof.

The lateral conductive line DWL may include a metal, a metal mixture, a metal alloy, or a semiconductor material. The lateral conductive line DWL may include titanium nitride, tungsten, polysilicon, or a combination thereof. For example, the lateral conductive line DWL may include a TiN/W stack in which titanium nitride and tungsten are sequentially stacked. The lateral conductive line DWL may include an N-type work function material or a P-type work function material. The N-type work function material may have a low work function of approximately 4.5 eV or less, and the P-type work function material may have a high work function of approximately 4.5 eV or more.

Each of the first and second lateral conductive lines WL1 and WL2 may include a first work function electrode G1, a second work function electrode G2, and a third work function electrode G3. The first work function electrode G1, the second work function electrode G2, and the third work function electrode G3 may be laterally disposed in the second direction D2. The first work function electrode G1, the second work function electrode G2, and the third work function electrode G3 may be parallel to each other while being in direct contact with each other. The second work function electrode G2 may be adjacent to the vertical conductive line BL, and the third work function electrode G3 may be adjacent to the data storage element CAP. The lateral layer ACT may have a thickness which is smaller than the thicknesses of the first, second, and third work function electrodes G1, G2, and G3.

The first work function electrode G1, the second work function electrode G2, and the third work function electrode G3 may be formed of different work function materials. The first work function electrode G1 may have a higher work function than the second and third work function electrodes G2 and G3. The first work function electrode G1 may include a high work function material. The first work function electrode G1 may have a work function which is higher than a mid-gap work function of silicon. The second and third work function electrodes G2 and G3 may include a low work function material. The second and third work function electrodes G2 and G3 may have a work function which is lower than the mid-gap work function of silicon. In other words, the high work function material may have a work function which is higher than approximately 4.5 eV, and the low work function material may have a work function which is lower than approximately 4.5 eV. The first work function electrode G1 may include a metal-based material, and the second and third work function electrodes G2 and G3 may include a semiconductor material.

The second and third work function electrodes G2 and G3 may include doped polysilicon which is doped with an N-type dopant (N-type dopant-doped polysilicon). The first work function electrode G1 may include a metal, a metal nitride, or a combination thereof. The first work function electrode G1 may include tungsten, titanium nitride, or a combination thereof. A barrier material may be further formed between the second and third work function electrodes G2 and G3 and the first work function electrode G1.

According to one embodiment of the present invention, each of the first and second lateral conductive lines WL1 and WL2 of the lateral conductive line DWL may have the second work function electrode G2—the first work function electrode G1—the third work function electrode G3 that are disposed laterally in order in the second direction D2 such as shown in FIG. 1B. The first work function electrode G1 may include a metal, and the second work function electrode G2 and the third work function electrode G3 may include polysilicon.

Each of the first and second lateral conductive lines WL1 and WL2 of the lateral conductive line DWL may have a PMP (Poly Si-Metal-Poly Si) structure in which polysilicon, a metal, and polysilicon are laterally disposed in the second direction D2. In the PMP structure, the first work function electrode G1 may be a metal-based material, and the second and third work function electrodes G2 and G3 may be doped polysilicon which is doped with an N-type dopant (N-type dopant doped polysilicon). The N-type dopant may include phosphorus or arsenic.

According to another embodiment of the present invention, referring to FIG. 1C, the first work function electrode G1 may include a stack in which a metal nitride liner G1L and a metal bulk layer G1B are stacked in the order shown in FIG. 1C. According to another embodiment of the present invention, the metal nitride liner G1L may include titanium nitride, tantalum nitride, tungsten nitride, or molybdenum nitride. The metal bulk layer G1B may include tungsten, molybdenum, or aluminum. For example, the first work function electrode G1 may include a 'titanium nitride/tungsten (TiN/W) stack', and the titanium nitride (TiN) may correspond to the metal nitride liner G1L, and tungsten (W) may correspond to the metal bulk layer G1B.

The first work function electrode G1 may have a larger volume than the second and third work function electrodes G2 and G3, and thus the lateral conductive line DWL may have a low resistance. The first work function electrodes G1 of the first and second lateral conductive lines WL1 and WL2 may vertically overlap in the first direction D1 with the lateral layer ACT interposed therebetween. The second and third work function electrodes G2 and G3 of the first and second lateral conductive lines WL1 and WL2 may vertically overlap in the first direction D1 with the lateral layer ACT interposed therebetween. The overlap area between the first work function electrode G1 and the lateral layer ACT may be greater than the overlap area between the second and third work function electrodes G2 and G3 and the lateral layer ACT. The second and third work function electrodes G2 and G3 and the first work function electrode G1 may extend in the third direction D3, and the second and third work function electrodes G2 and G3 and the first work function electrode G1 may be in direct contact.

As described above, each of the first and second lateral conductive lines WL1 and WL2 may have a triple electrode structure including the first, second, and third work function electrodes G1, G2, and G3. The lateral conductive line DWL may include a pair of first work function electrodes G1, a pair of second work function electrodes G2, and a pair of third work function electrodes G3 that are extending in the third direction D3 crossing the lateral layer ACT with the lateral layer ACT interposed therebetween. As shown in FIG. 1C, the first work function electrodes G1 of the lateral conductive line DWL may vertically overlap with the channel CH, the second work function electrodes G2 of the lateral conductive line DWL may vertically overlap with the first doped region SR of the lateral layer ACT, and the third work function electrodes G3 of the lateral conductive line DWL may vertically overlap with the second doped region DR of the lateral layer ACT.

As shown in FIG. 1B, the first work function electrode G1 having a high work function may be disposed at the center of the lateral conductive line DWL, and the second and third work function electrodes G2 and G3 having a low work function may be disposed at both ends of the lateral conductive line DWL. In this way, it is possible to reduce leakage current, such as GIDL (Gate Induced Drain leakage).

With the first work function electrode G1 having a high work function being disposed at the center of the lateral conductive line DWL, the threshold voltage of the switching element TR may be increased. Since the second work function electrode G2 of the lateral conductive line DWL has a low work function, a low electric field may be formed between the vertical conductive line BL and the lateral conductive line DWL. Since the third work function electrode G3 of the lateral conductive line DWL has a low work function, a low electric field may be formed between the data storage element CAP and the lateral conductive line DWL.

The data storage element CAP may be disposed laterally from the switching element TR in the second direction D2. The data storage element CAP may include a first electrode SN that extends laterally from the lateral layer ACT in the second direction D2. The data storage element CAP may further include a second electrode PN over the first electrode SN and a dielectric layer DE between the first electrode SN and the second electrode PN. The first electrode SN, the dielectric layer DE, and the second electrode PN may be arranged laterally in the second direction D2. The first electrode SN may have a laterally oriented cylindrical shape. The dielectric layer DE may conformally cover the cylindrical inner wall and the cylindrical outer wall of the first electrode SN. The second electrode PN may cover the cylindrical inner wall and the cylindrical outer wall of the first electrode SN over the dielectric layer DE. The first electrode SN may be electrically connected to the second doped region DR.

The first electrode SN may have a three-dimensional structure, and the first electrode SN of the three-dimensional structure may have a lateral three-dimensional structure which is oriented in the second direction D2. As an example of the three-dimensional structure, the first electrode SN may have a cylindrical shape, According to another embodiment of the present invention, the first electrode SN may have a pillar shape or a pylinder shape. The pylinder shape may refer to a structure in which a pillar shape and a cylindrical shape are merged.

The first electrode SN and the second electrode PN may include a metal, a noble metal, a metal nitride, a conductive metal oxide, a conductive noble metal oxide, a metal carbide, a metal silicide, or a combination thereof. For example, the first electrode SN and the second electrode PN may include titanium (Ti), titanium nitride (TiN), tantalum (Ta), tantalum nitride (TaN), tungsten (W), tungsten nitride (WN), ruthenium (Ru), ruthenium oxide (RuO$_2$), iridium (Ir), iridium oxide (IrO$_2$), platinum (Pt), molybdenum (Mo), molybdenum oxide (MoO), a titanium nitride/tungsten (TiN/W) stack, a tungsten nitride/tungsten (WN/W) stack. The second electrode PN may include a combination of a metal-based material and a silicon-based material. For example, the second electrode PN may be a stack of titanium nitride/silicon germanium/tungsten nitride (TiN/SiGe/WN). In the titanium nitride/silicon germanium/tungsten nitride (TiN/SiGe/WN) stack, silicon germanium may be a gap-fill material filling the cylindrical inside of the first electrode SN, and titanium nitride (TiN) may serve as the second electrode PN of the data storage element CAP, and tungsten nitride may be a low-resistance material.

The dielectric layer DE may be referred to as a capacitor dielectric layer or a memory layer. The dielectric layer DE may include silicon oxide, silicon nitride, a high-k material, or a combination thereof. The high-k material may have a higher dielectric constant than silicon oxide. Silicon oxide (SiO$_2$) may have a dielectric constant of approximately 3.9, and the dielectric layer DE may include a high-k material having a dielectric constant of approximately 4 or more. The high-k material may have a dielectric constant of approximately 20 or more. The high-k material may include hafnium oxide (HfO$_2$), zirconium oxide (ZrO$_2$), aluminum oxide (Al$_2$O$_3$), lanthanum oxide (La$_2$O$_3$), titanium oxide (TiO$_2$), tantalum oxide (Ta$_2$O$_5$), niobium oxide (Nb$_2$O$_5$) or strontium titanium oxide (SrTiO$_3$). According to another embodiment of the present invention, the dielectric layer DE may be formed of a composite layer including two or more layers of the aforementioned high-k materials.

The dielectric layer DE may be formed of zirconium (Zr)-based oxide. The dielectric layer DE may have a stack structure including at least zirconium oxide (ZrO$_2$). The stack structure including zirconium oxide (ZrO$_2$) may include a ZA (ZrO$_2$/Al$_2$O$_3$) stack or a ZAZ (ZrO$_2$/Al$_2$O$_3$/ZrO$_2$) stack. The ZA stack may have a structure in which aluminum oxide (Al$_2$O$_3$) is stacked over zirconium oxide (ZrO$_2$). The ZAZ stack may have a structure in which zirconium oxide (ZrO$_2$), aluminum oxide (Al$_2$O$_3$), and zirconium oxide (ZrO$_2$) are sequentially stacked. The ZA stack and the ZAZ stack may be referred to as a zirconium oxide (ZrO$_2$)-based layer. According to another embodiment of the present invention, the dielectric layer DE may be formed of hafnium (Hf)-based oxide. The dielectric layer DE may have a stack structure including hafnium oxide (HfO$_2$). The stack structure including hafnium oxide (HfO$_2$) may include an HA (HfO$_2$/Al$_2$O$_3$) stack or an HAH (HfO$_2$/Al$_2$O$_3$/HfO$_2$) stack. The HA stack may have a structure in which aluminum oxide (Al$_2$O$_3$) is stacked over hafnium oxide (HfO$_2$). The HAH stack may have a structure in which hafnium oxide (HfO$_2$), aluminum oxide (Al$_2$O$_3$), and hafnium oxide (HfO$_2$) are sequentially stacked. The HA stack and the HAH stack may be referred to as a hafnium oxide (HfO$_2$)-based layer. In the ZA stack, ZAZ stack, HA stack, and HAH stack, aluminum oxide (Al$_2$O$_3$) may have a greater bandgap energy (which will be, hereinafter, simply referred to as bandgap) than zirconium oxide (ZrO$_2$) and hafnium oxide (HfO$_2$). Aluminum oxide (Al$_2$O$_3$) may have a lower dielectric constant than zirconium oxide (ZrO$_2$) and hafnium oxide (HfO$_2$). Accordingly, the dielectric layer DE may include a stack of a high-k material and a high-bandgap material having a greater bandgap than the high-k material. The dielectric layer DE may include silicon oxide (SiO$_2$) as a high bandgap material other than aluminum oxide (Al$_2$O$_3$). Since the dielectric layer DE includes a high bandgap material, leakage current may be suppressed. The high-bandgap material may be thinner than the high-k material. According to another embodiment of the present invention, the dielectric layer DE may include a laminated structure in which a high-k material and a high-bandgap material are alternately stacked. For example, it may include a ZAZA (ZrO$_2$/Al$_2$O$_3$/ZrO$_2$/Al$_2$O$_3$) stack, a ZAZAZ (ZrO$_2$/Al$_2$O$_3$/ZrO$_2$/Al$_2$O$_3$/ZrO$_2$) stack, a HAHA (HfO$_2$/Al$_2$O$_3$/HfO$_2$/Al$_2$O$_3$) stack, or a HAHAH (HfO$_2$/Al$_2$O$_3$/HfO$_2$/Al$_2$O$_3$/HfO$_2$) stack. In the above laminated structure, the aluminum oxide (Al$_2$O$_3$) may be thinner than the zirconium oxide (ZrO$_2$) and/or the hafnium oxide (HfO$_2$).

According to another embodiment of the present invention, the dielectric layer DE may include a stack structure, a laminated structure, or a mixed structure including zirconium oxide, hafnium oxide, and aluminum oxide.

According to another embodiment of the present invention, an interface control layer for reducing leakage current may be further formed between the first electrode SN and the dielectric layer DE. The interface control layer may include titanium oxide (TiO$_2$), tantalum oxide (Ta$_2$O$_5$), or niobium oxide (Nb$_2$O$_5$). The interface control layer may also be formed between the second electrode PN and the dielectric layer DE.

The data storage element CAP may include a metal-insulator-metal (MIM) capacitor. The first electrode SN and the second electrode PN may include a metal-based material.

The data storage element CAP may be replaced with another data storage material. For example, the data storage material may be a phase change material, a magnetic tunnel junction (MTJ), or a variable resistance material.

As described above, the memory cell MC may include a lateral conductive line DWL having a triple work function electrode structure. Each of the first and second lateral conductive lines WL1 and WL2 of the lateral conductive line DWL may include a first work function electrode G1, a second work function electrode G2, and a third work function electrode G3, The first work function electrode G1 may overlap with the channel CH, and the second work function electrode G2 may be disposed adjacent to the vertical conductive line BL and the first doped region SR. The third work function electrode G3 may be disposed adjacent to the data storage element CAP and the second doped region DR. Due to the low work function of the second work function electrode G2, a low electric field may be formed between the lateral conductive line DWL and the vertical conductive line BL to reduce leakage current, Due to the low work function of the third work function electrode G3, a low electric field may be formed between the lateral conductive line DWL and the data storage element CAP to reduce leakage current. Due to the high work function of the first work function electrode G1, not only a high threshold voltage of the switching element TR may be formed, but also the height of the memory cell MC may be lowered by forming a low electric field, which is advantageous in terms of high density device integration.

As Comparative Example 1, when the first and second lateral conductive lines WL1 and WL2 are formed of a metal-based material alone, due to the high work function of the metal-based material, a high electric field may be formed between the first and second lateral conductive lines WL1 and WL2 and the data storage element CAP. The high electric field formed between the first and second lateral conductive lines WL1 and WL2 and the data storage element CAP increases the leakage current of the memory cell MC. The increased leakage current originating from the high electric field may become worse as the channel CH becomes thinner.

As Comparative Example 2, when the first and second lateral conductive lines WL1 and WL2 are formed of a low work function material alone, the threshold voltage of the switching element TR may be decreased due to the low work function, thus also causing leakage current.

According to one embodiment of the present invention, since each of the first and second lateral conductive lines WL1 and WL2 of the lateral conductive line DWL has a triple electrode structure, leakage current is reduced, and thus the memory cell MC may acquire refresh characteristics. This also may make it possible to reduce power consumption.

Also, according to one embodiment of the present invention, since each of the first and second lateral conductive lines WL1 and WL2 of the lateral conductive line DWL has a triple electrode structure, even though the thickness of the channel CH is reduced for high density device integration, it may be relatively advantageous for increasing the electric field in the reduced thickness of channel CH. Therefore, it may be possible to realize a high number of stacking stages.

Figure 2A:
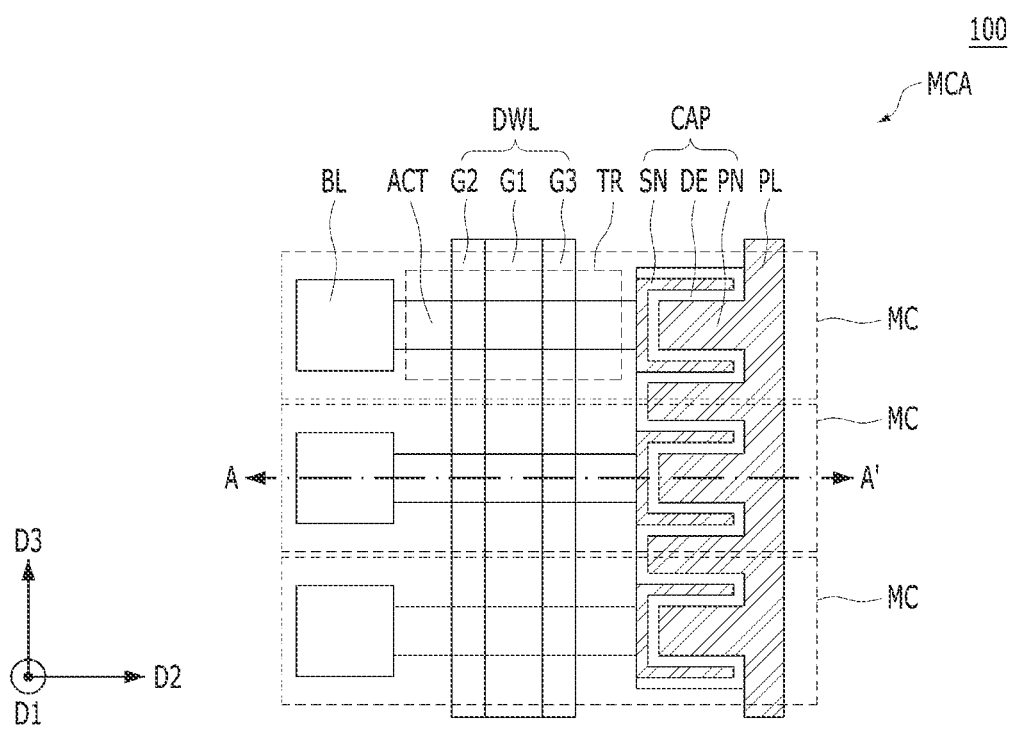
FIG. 2A is a schematic plan view illustrating a semiconductor device in accordance with one embodiment of the present invention.

FIG. 2A is a schematic plan view illustrating a semiconductor device in accordance with one embodiment of the present invention. FIG. 23 is a cross-sectional view taken along a line A-A' of FIG. 2A.

Figure 2B:
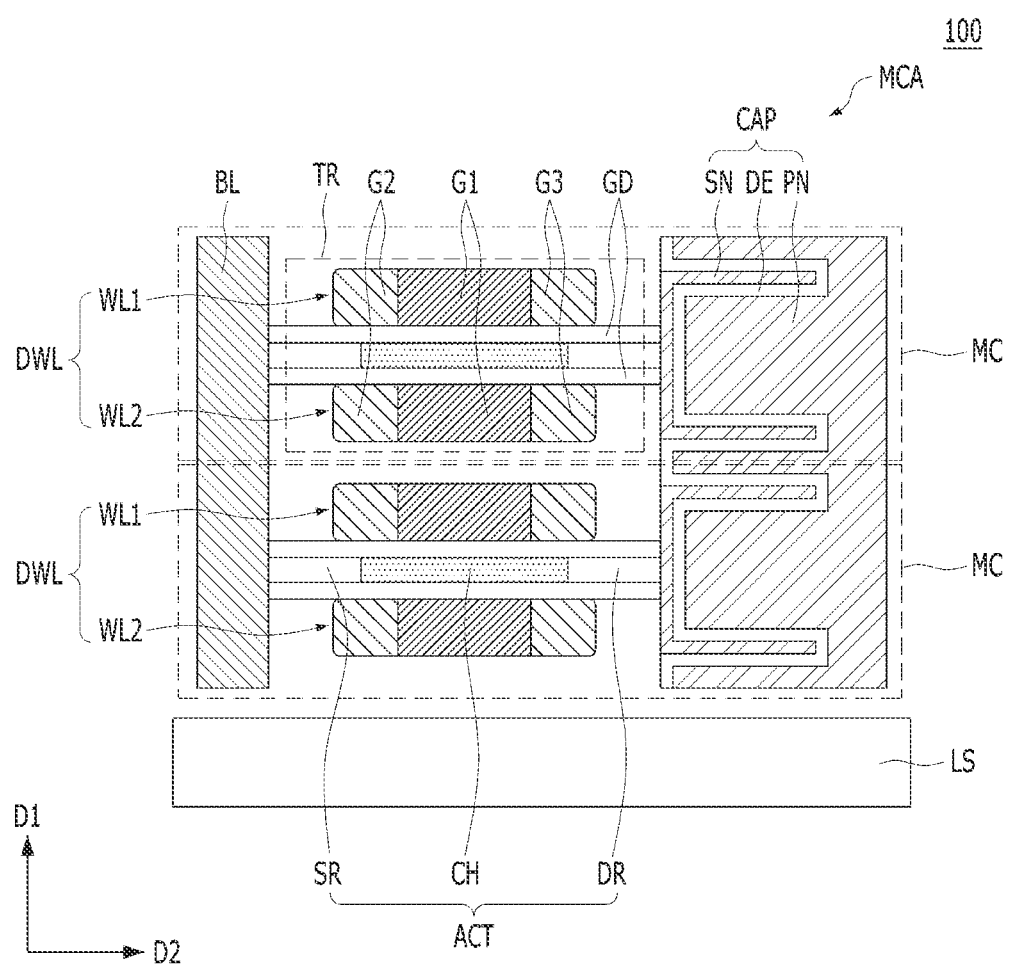
FIG. 2B is a cross-sectional view taken along a line A-A' of FIG. 2A.

Referring to FIGS. 2A and 2B, the semiconductor device 100 may include a lower structure LS and a memory cell array MCA. The memory cell array MCA may include a three-dimensional array of memory cells MC, The three-dimensional array of memory cells MC may include a column array of memory cells MC and a row array of memory cells MC. A plurality of memory cells MC may be stacked in the column array of memory cells MC in the first direction D1, and a plurality of memory cells MC may be stacked in the third direction D3 in the row array of memory cells MC. The memory cells MC may be laterally disposed. According to various embodiments of the present invention, cell dielectric layers may be disposed between the memory cells MC that are stacked in the first direction D1.

The individual memory cell MC may include a vertical conductive line BL, a switching element TR, and a data storage element CAP. The individual switching element TR may be a transistor and may include a lateral layer ACT, a gate dielectric layer GD, and a lateral conductive line DWL. Each lateral layer ACT may include a first doped region SR, a second doped region DR, and a channel CH between the first doped region SR and the second doped region DR. The lateral conductive line DWL may include a pair of a first lateral conductive line WL1 and a second lateral conductive line WL2, Each of the first lateral conductive line WL1 and the second lateral conductive line WL2 may include a first work function electrode G1, a second work function electrode G2, and a third work function electrode G3. The data storage element CAP may include a first electrode SN, a second electrode PN, and a dielectric layer DE between the first electrode SN and the second electrode PN.

The column array of memory cells MC may include a plurality of switching elements TR that are stacked in the first direction D1, and the row array of memory cells MC may include a plurality of switching elements TR that are arranged laterally in the third direction D3.

The lateral layers ACT may be stacked over the lower structure LS in the first direction D1, and the lateral layers ACT may be spaced apart from the lower structure LS to extend in the second direction D2 which is for example parallel to the surface of the lower structure LS.

The vertical conductive line BL may extend above the lower structure LS in the first direction D1 which is for example perpendicular to the surface of the lower structure LS, and may be coupled to first-side ends of the lateral layers ACT.

The data storage elements CAP may be respectively coupled to second-side ends of the lateral layers ACT.

The lateral conductive lines DWL may be stacked over the lower structure LS in the first direction D1, and the lateral conductive lines DWL may be spaced apart from the lower structure LS to extend in the third direction D3 which is parallel to the surface of the lower structure LS.

As shown in FIG. 2A, the second electrodes PN of the data storage elements CAP may be coupled to a common plate PL. The lateral layers ACT of the switching elements TR that are laterally arranged in the third direction D3 may share one lateral conductive line DWL. The lateral layers ACT of the switching elements TR that are laterally arranged in the third direction D3 may be coupled to different vertical conductive lines BL. The switching elements TR stacked in the first direction D1 may share one vertical conductive line BL. The switching elements TR laterally arranged in the third direction D3 may share one lateral conductive line DWL.

As shown in FIG. 2B, the lower structure LS may include a semiconductor substrate or a peripheral circuit portion. The lower structure LS may be disposed at a lower level than the memory cell array MCA. This may be referred to as a COP (Cell over PERI) structure. The peripheral circuit portion may include at least one control circuit for driving the memory cell array MCA. At least one control circuit of the peripheral circuit portion may include an N-channel transistor, a P-channel transistor, a CMOS circuit, or a combination thereof, At least one control circuit of the peripheral circuit portion may include an address decoder circuit, a read circuit, a write circuit, and the like. At least one control circuit of the peripheral circuit portion may include a planar channel transistor, a recess channel transistor, a buried gate transistor, a fin channel transistor (Fin-FET), etc.

For example, the peripheral circuit portion may include sub-word line drivers and a sense amplifier. The lateral conductive lines DWL may be coupled to the sub-word line drivers. The vertical conductive line BL may be coupled to the sense amplifier.

According to another embodiment of the present invention, the peripheral circuit portion may be disposed at a higher level than the memory cell array MCA. This may be referred to as a POC (PERI over Cell) structure.

The memory cell array MCA may include lateral conductive lines DWL that are stacked in the first direction D1. The individual lateral conductive lines DWL may include a pair of a first lateral conductive line WL1 and a second lateral conductive line WL2.

Each of the first and second lateral conductive lines WL1 and WL2 may include a first work function electrode G1, a second work function electrode G2, and a third work function electrode G3. The first work function electrode G1, the second work function electrode G2, and the third work function electrode G3 may be laterally disposed in the second direction D2. The first work function electrode G1, the second work function electrode G2, and the third work function electrode G3 may be parallel to each other while being in direct contact with each other. The second work function electrode G2 may be adjacent to the vertical conductive line BL, and the third work function electrode G3 may be adjacent to the data storage element CAP. The first work function electrode G1, the second work function electrode G2, and the third work function electrode G3 may be formed of different work function materials. The first work function electrode G1 may have a higher work function than the second and third work function electrodes G2 and G3. The first work function electrode G1 may include a high work function material. The first work function electrode G1 may have a work function which is higher than a mid-gap work function of silicon. The second and third work function electrodes G2 and G3 may include a low work function material. The second and third work function electrodes G2 and G3 may have a work function which is lower than the mid-gap work function of silicon. In other words, the high work function material may have a work function which is higher than approximately 4.5 eV, and the low work function material may have a work function which is lower than approximately 4.5 eV.

The first work function electrode G1 may include a metal-based material, and the second and third work function electrodes G2 and G3 may include a semiconductor material. The second and third work function electrodes G2 and G3 may include doped polysilicon which is doped with an N-type dopant (N-type dopant-doped polysilicon). The first work function electrode G1 may include a metal, a metal nitride, or a combination thereof. The first work function electrode G1 may include tungsten, titanium nitride, or a combination thereof, A barrier material may be further formed between the second and third work function electrodes G2 and G3 and the first work function electrode G1.

The first work function electrode G1 may have a larger volume than the second and third work function electrodes G2 and G3, and thus the lateral conductive line DWL may have a low resistance. The first work function electrodes G1 of the first and second lateral conductive lines WL1 and WL2 may vertically overlap in the first direction D1 with the lateral layer ACT interposed therebetween. The second and third work function electrodes G2 and G3 of the first and second lateral conductive lines WL1 and WL2 may vertically overlap in the first direction D1 with the lateral layer ACT interposed therebetween. The overlap area between the first work function electrode G1 and the lateral layer ACT may be greater than the overlap area between the second and third work function electrodes G2 and G3 and the lateral layer ACT. The second and third work function electrodes G2 and G3 and the first work function electrode G1 may extend in the third direction D3, and the second and third work function electrodes G2 and G3 and the first work function electrode G1 may be in direct contact.

Each of the first and second lateral conductive lines WL1 and WL2 of the lateral conductive line DWL may have a PMP (Poly Si-Metal-Poly Si) structure in which polysilicon, a metal, and polysilicon are laterally disposed in the second direction D2. In the PMP structure, the first work function electrode G1 may be a 'TiN/W stack', and the second and third work function electrodes G2 and G3 may be doped polysilicon which is doped with an N-type dopant (N-type dopant doped polysilicon).

As described above, each of the first and second lateral conductive lines WL1 and WL2 may have a triple electrode structure including the first, second, and third work function electrodes G1, G2, and G3. The lateral conductive line DWL may include a pair of first work function electrodes G1, a pair of second work function electrodes G2, and a pair of third work function electrodes G3 that are extending in the third direction D3 crossing the lateral layer ACT with the lateral layer ACT interposed therebetween.

Figure 3:
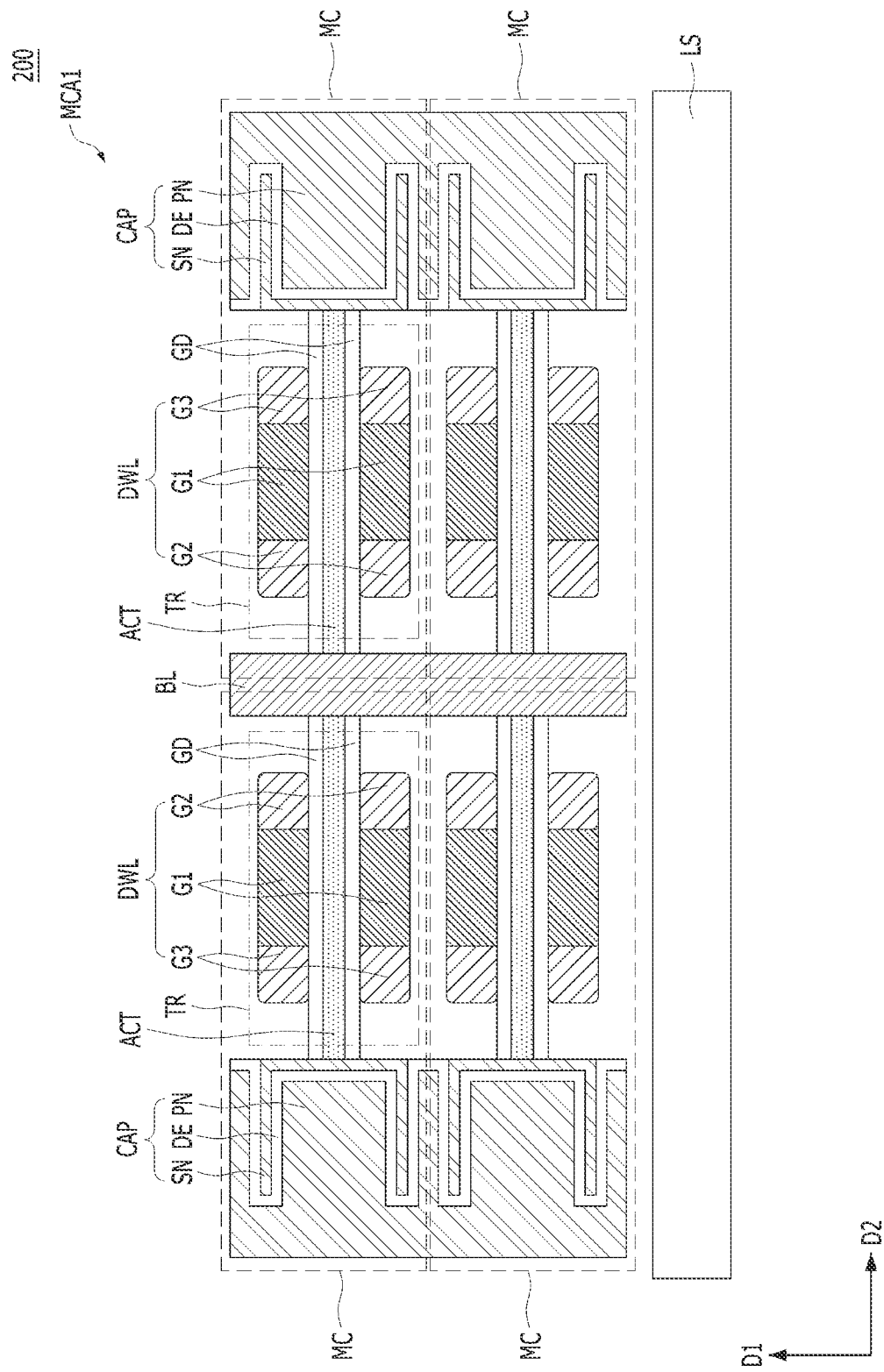
FIG. 3 is a schematic cross-sectional view illustrating a semiconductor device in accordance with another embodiment of the present invention.

FIG. 3 is a schematic cross-sectional view illustrating a semiconductor device in accordance with another embodiment of the present invention. In FIG. 3, detailed descriptions on the constituent elements also appearing in FIGS. 1A, 1B, 2A and 2B will be omitted.

Referring to FIG. 3, the semiconductor device 200 may include a memory cell array MCA1, and the memory cell array MCA1 may have a mirror-type structure sharing a vertical conductive line BL. Illustrated herein is an example where the memory cell array MCA1 is a three-dimensional memory cell array including four memory cells MC. Each memory cell MC may include a switching element TR including a lateral layer ACT and a lateral conductive line DWL, a vertical conductive line BL, and a data storage element CAP. The lateral conductive line DWL may include a first work function electrode G1, a second work function electrode G2, and a third work function electrode G3. The data storage element CAP may include a first electrode SN, a dielectric layer DE, and a second electrode PN. A gate dielectric layer GD may be disposed between the lateral conductive line DWL and the lateral layer ACT. Similar to that shown in FIGS. 1C and 2B, the lateral layer ACT in FIG. 3 may include a first doped region SR, a channel CH, and a second doped region DR. The first work function electrode G1 of the lateral conductive line DWL may include a high work function material, and the second work function electrode G2 and the third work function electrode G3 may include a low work function material. The first work function electrode G1 may include a metal-based material, and the second and third work function electrodes G2 and G3 may include a semiconductor material. Similar to that shown in FIG. 1C, the first work function electrode G1 of the lateral conductive line DWL in FIG. 3 may include a metal nitride liner GIL and a metal bulk layer G1B.

The lateral layers ACT of memory cells MC that are disposed adjacent to each other in the first direction D1 may contact one vertical conductive line BL. The data storage elements CAP may be coupled to the lateral layers ACT, respectively.

As shown in FIG. 3, the semiconductor device 200 may further include a lower structure LS below the memory cell array MCA1, and the lower structure LS may include a peripheral circuit portion. The peripheral circuit portion may be disposed at a lower level than the memory cell array MCA1. This may be referred to as a COP (Cell over PERI) structure. The peripheral circuit portion may include at least one control circuit for driving the memory cell array MCA1.

According to another embodiment of the present invention, the peripheral circuit portion may be disposed at a higher level than the memory cell array MCA1. This may be referred to as a POC (PERI over Cell) structure.

FIGS. 4 to 20 are cross-sectional views illustrating an example of a method for fabricating a semiconductor device in accordance with one embodiment of the present invention.

Figure 4:
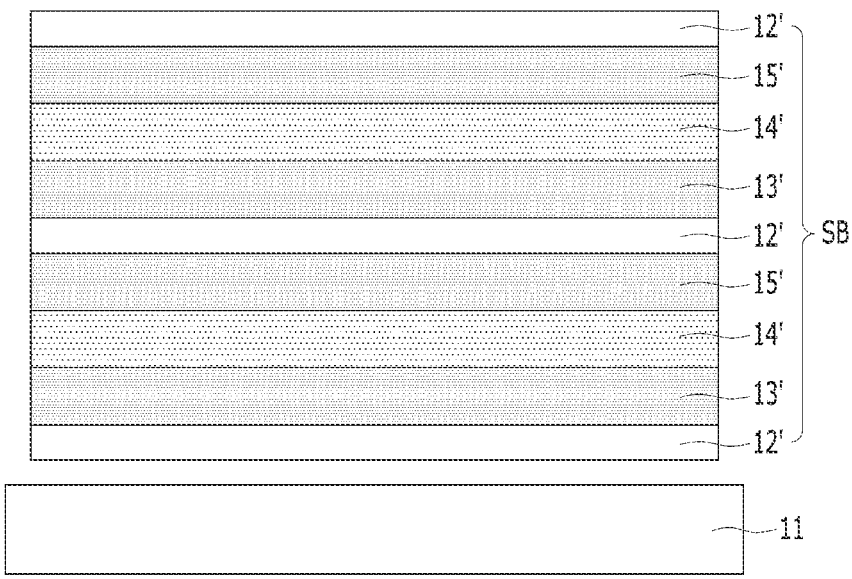
FIGS. 4 to 20 are cross-sectional views illustrating an example of a method for fabricating a semiconductor device In accordance with yet another embodiment of the present invention.

Referring to FIG. 4, a stack body SB may be formed over the lower structure 11. A plurality of sub-stacks may be alternately stacked in the stack body SB. Each of the sub-stacks may include a dielectric layer 12', a first sacrificial layer 13', a semiconductor layer 14', and a second sacrificial layer 15' that are stacked in the order shown in FIG. 4. The dielectric layers 12' may include silicon oxide, and the first and second sacrificial layers 13' and 15' may include silicon nitride. The semiconductor layer 14' may include a semiconductor material or an oxide semiconductor material. The semiconductor layer 14' may include monocrystalline silicon, polysilicon, or indium gallium zinc oxide (IGZO). As described in the above embodiments, when the memory cells are stacked, the stack body SB may be stacked several times.

Figure 5:
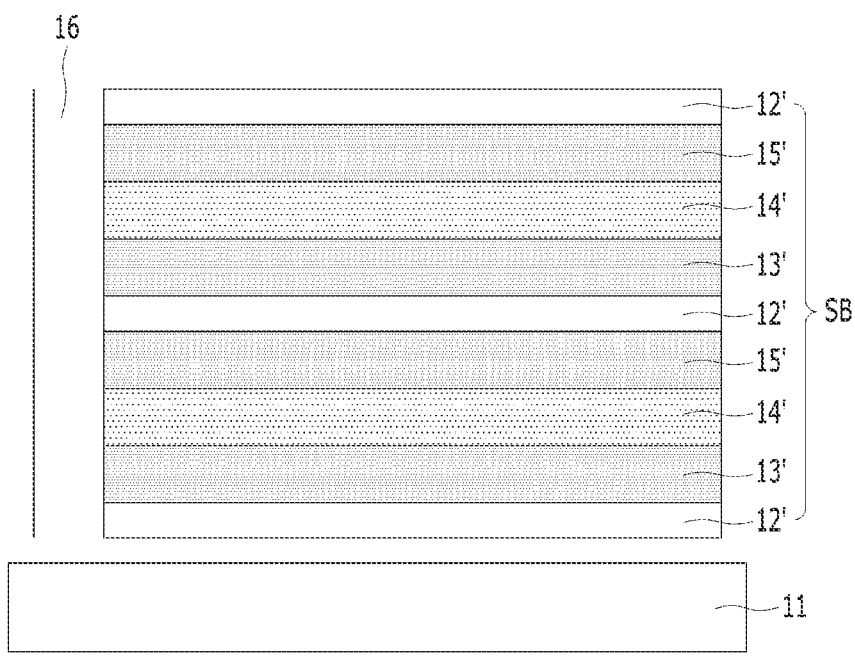

Referring to FIG. 5, a portion of the stack body SB may be etched to form a first opening 16. The first opening 16 may extend vertically from the surface of the lower structure 11. Before the first opening 16 is formed, as shown in FIGS. 2A and 2B, the stack body SB may be patterned on the basis of a memory cell.

Figure 6:
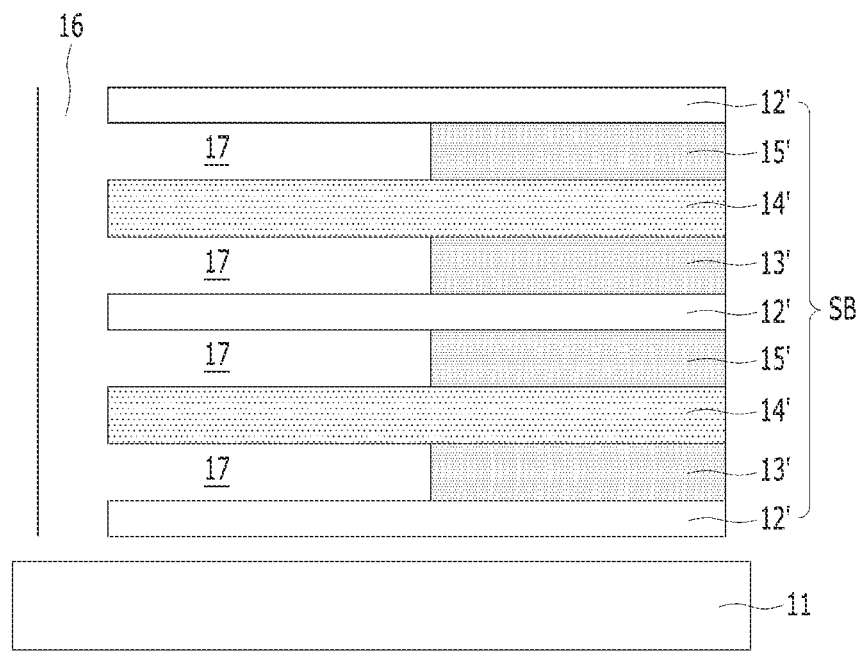

Referring to FIG. 6, the first and second sacrificial layers 13' and 15' may be selectively etched through the first opening 16 to form recesses 17, A portion of the semiconductor layer 14' may be exposed by the recesses 17. The recesses 17 may be disposed between the dielectric layers 12'.

Figure 7:
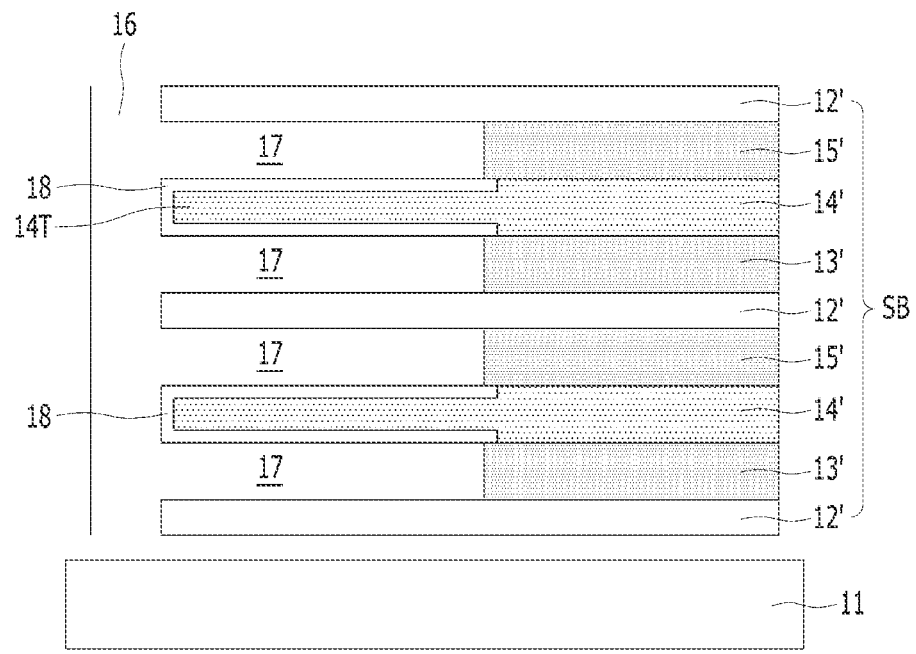

Referring to FIG. 7, a gate dielectric layer 18 may be formed over the exposed portion of the semiconductor layer 14'. The gate dielectric layer 18 may include silicon oxide, silicon nitride, a metal oxide, a metal oxynitride, a metal silicate, a high-k material, a ferroelectric material, an anti-ferroelectric material, or a combination thereof. The gate dielectric layer 18 may include $SiO_2$, $Si_3N_4$, $HfO_2$, $Al_2O_3$, $ZrO_2$, AlON, HfON, HfSiO, HfSiON, and the like.

According to one embodiment of the present invention, the gate dielectric layer 18 may be formed by an oxidation process, and a thin portion 14T of the semiconductor layer 14' may be thinned due to the oxidation process. The thin portion 14T of the semiconductor layer 14' may be referred to as a thin-body.

Figure 8:
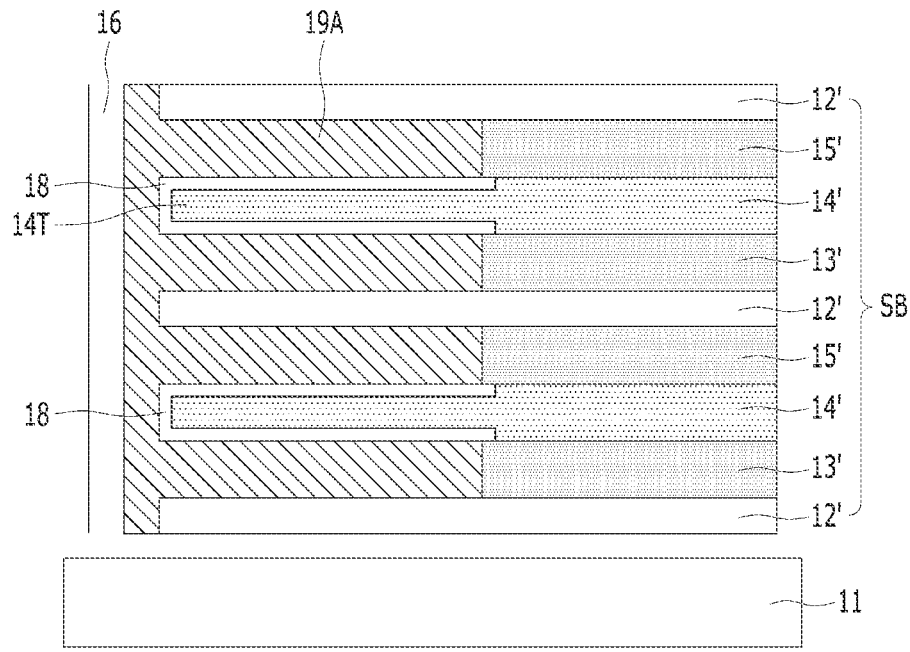

Referring to FIG. 8, the recesses 17 may be filled with a first work function material 19A. The first work function material 19A may fill the recesses 17 over the gate dielectric layer 18. The first work function material 19A may include a conductive material. The first work function material 19A may have a work function which is lower than the mid-gap work function of silicon. For example, the first work function material 19A may include polysilicon which is doped with an N-type dopant. The N-type dopant may include phosphorus (P) or arsenic (As).

Figure 9:
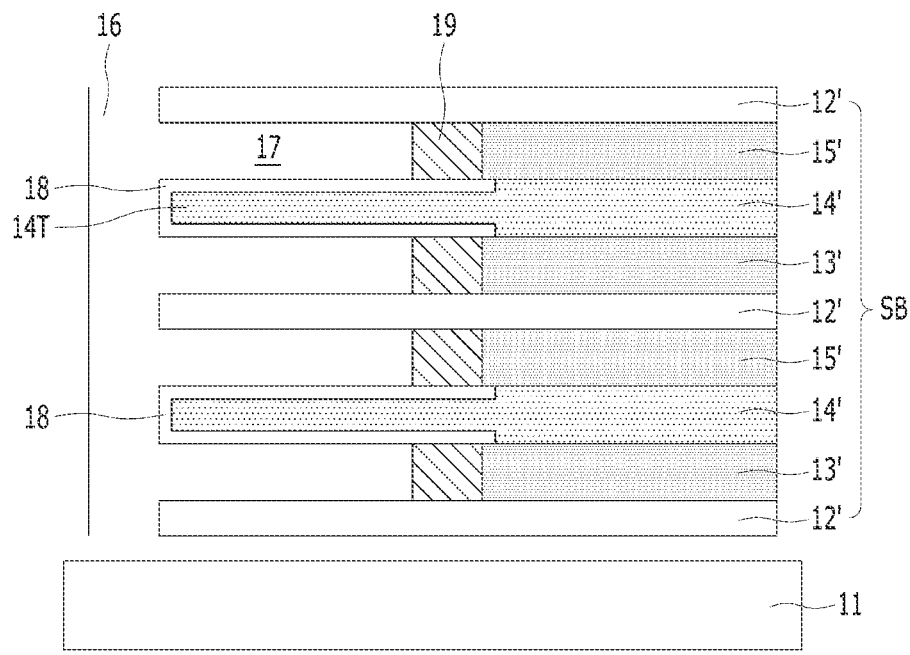

Referring to FIG. 9, the first low work function electrode 19 may be formed in the recesses 17. To form the first low work function electrode 19, the first work function material 19A may be selectively etched. For example, wet etching of the first work function material 19A may be performed.

A pair of first low work function electrodes 19 may be formed with the semiconductor layer 14' interposed therebetween.

Figure 10:
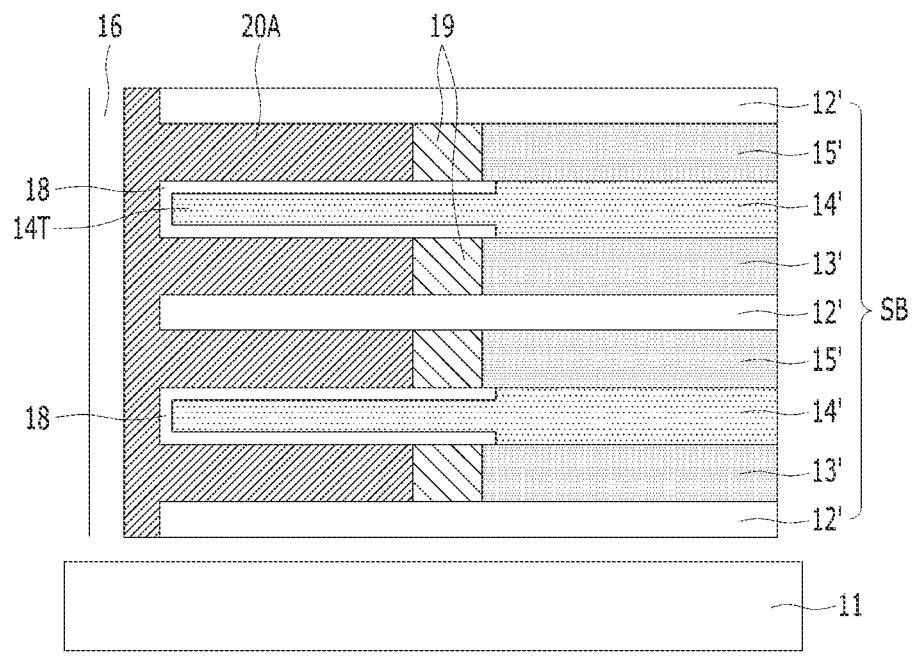

Referring to FIG. 10, a second work function material 20A may be formed over the first low work function electrode 19 to gap-fill the remaining portion of the recesses 17. The second work function material 20A may have a work function which is higher than the mid-gap work function of silicon. The second work function material 20A may have a higher work function than the first low work function electrode 19. The second work function material 20A may have a lower resistance than the first low work function electrode 19. The second work function material 20A may include a metal-based material. The second work function material 20A may include a metal nitride, a metal, or a combination thereof. The second work function material 20A may include titanium nitride, tungsten, or a combination thereof. The second work function material 20A may be formed by sequentially stacking titanium nitride and tungsten.

Figure 11:
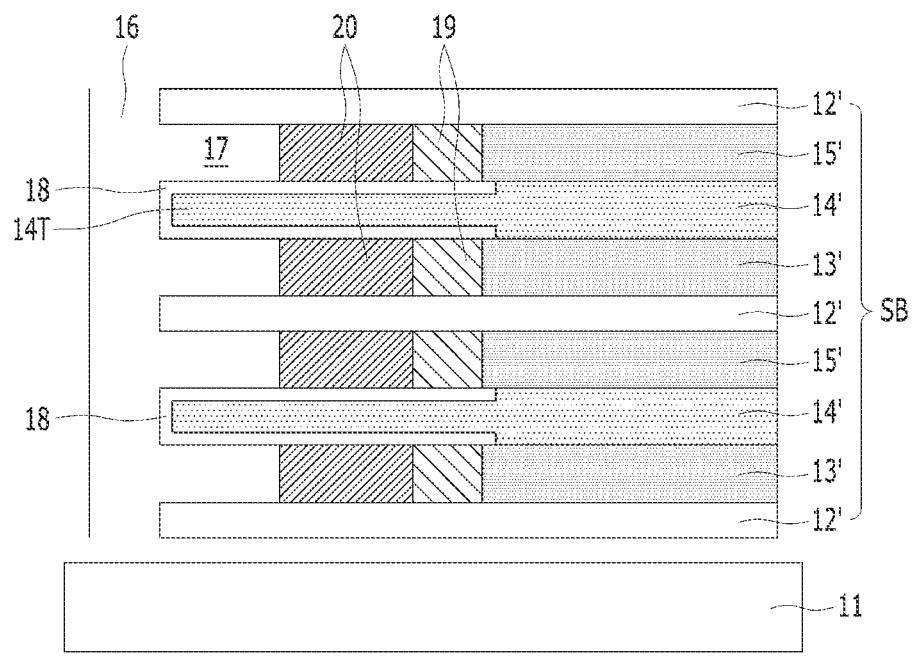

Referring to FIG. 11, a high work function electrode 20 may be formed in the recesses 17. To form the high work function electrode the second work function material 20A may be selectively etched. For example, wet etching of the second work function material 20A may be performed.

The high work function electrode 20 may contact first sides of the first low work function electrode 19. The high work function electrode 20 may have a higher work function than the first low work function electrode 19. The high work function electrode 20 may include a metal-based material. For example, the high work function electrode 20 may include titanium nitride, tungsten, or a combination thereof.

A pair of high work function electrodes 20 may be formed with the semiconductor layer 14' interposed therebetween. The first low work function electrodes 19 and the high work function electrodes 20 may partially fill the recesses 17.

Figure 12:
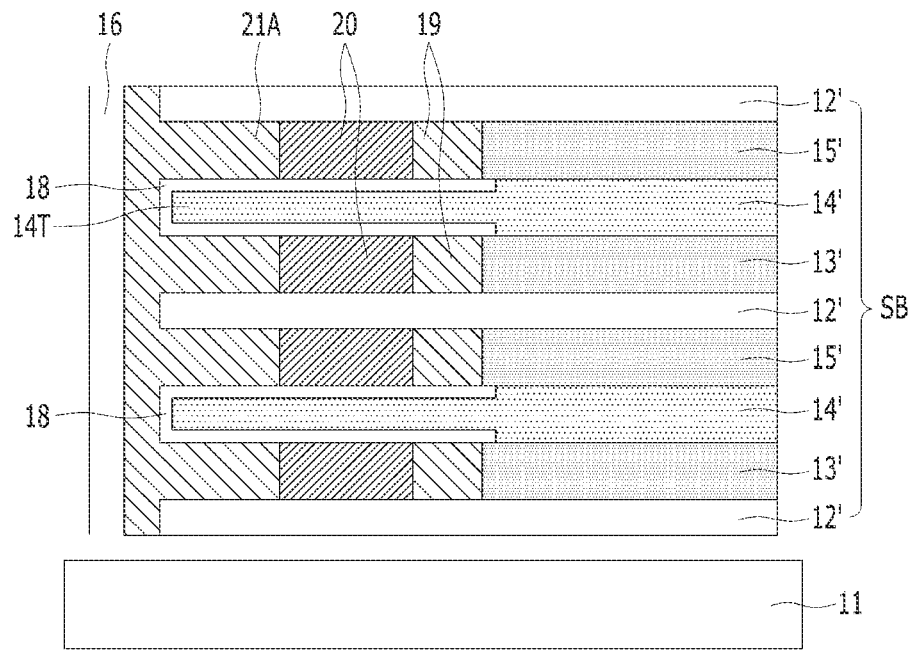

Referring to FIG. 12, the remaining spaces of the recesses 17 may be filled with the third work function material 21I, The third work function material 21A may fill the remaining space of the recesses 17 over the gate dielectric layer 18. The third work function material 21A may include a conductive material. The third work function material 21A may have a work function which is lower than the mid-gap work function of silicon. For example, the third work function material 21A may include polysilicon which is doped with an N-type dopant. The first low work function electrode 19 and the third work function material 21A may be the same material.

Figure 13:
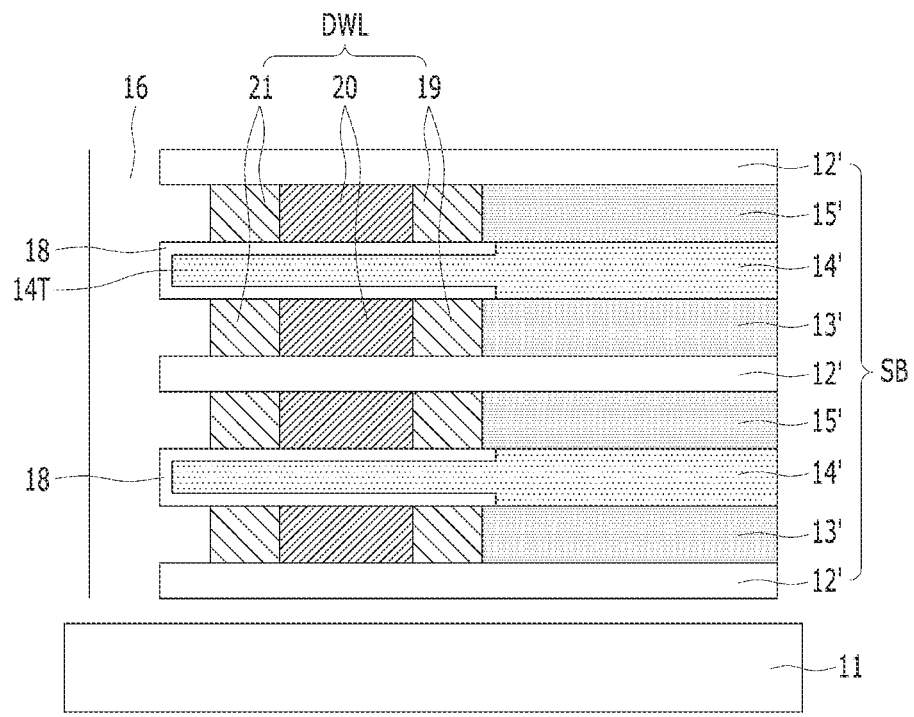

Referring to FIG. 13, a second low work function electrode 21 may be formed in the recesses 17. To form the second low work function electrode 21, the third work function material 21A may be selectively etched. For example, wet etching of the third work function material 21A may be performed.

A pair of second low work function electrodes 21 may be formed with the semiconductor layer 14' interposed therebetween.

A pair of first low work function electrodes 19, a pair of high work function electrodes 20, and a pair of second low work function electrode 21 may be formed with the semiconductor layer 14' interposed therebetween. The pair of first low work function electrodes 19, the pair of high work function electrodes 20, and the pair of second low work function electrodes 21 may form a lateral conductive line DWL having a double structure. The first work function electrodes G1 as illustrated in FIGS. 1A to 3 may correspond to the high work function electrodes 20. The second work function electrodes G2 as illustrated in FIGS. 1A to 3 may correspond to the second low work function electrodes 21. The third work function electrodes G3 as illustrated in FIGS. 1A to 3 may correspond to the first low work function electrode 19. The high work function electrode 19 may be parallel to the first low work function electrode 19 but may have a higher work function than the first low work function electrode 19. The second low work function electrode 21 may be parallel to the high work function electrode 19 and may have a lower work function than the high work function electrode 19.

Figure 14:
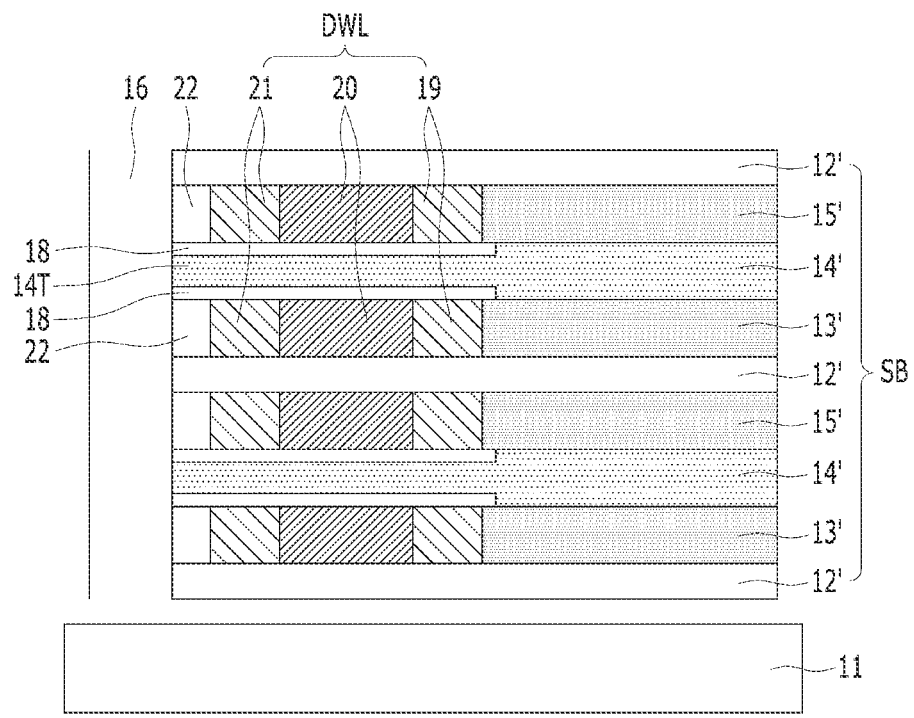

Referring to FIG. 14, first capping layers 22 may be formed on the side surface of the second low work function electrodes 21. The first capping layers 22 may include silicon oxide or silicon nitride. The first capping layers 22 may fill the remaining spaces of the recesses 17.

Subsequently, a portion of the gate dielectric layer 18 exposed by the first capping layers 22 may be etched to expose a first-side end of the semiconductor layer 14'.

Figure 15:
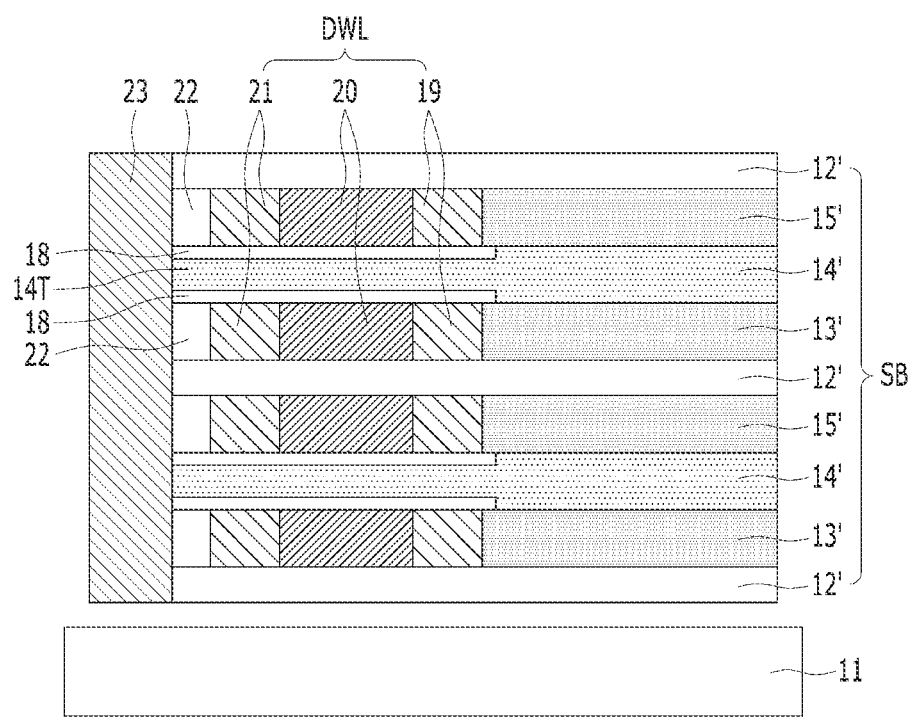

Referring to FIG. 15, a vertical conductive line 23 coupled to the first-side end of the semiconductor layer 14' may be formed. The vertical conductive line 23 may fill the first opening 16, The vertical conductive line 23 may include titanium nitride, tungsten, or a combination thereof.

According to another embodiment of the present invention, before the vertical conductive line 23 is formed, a first doped region may be formed in the first-side end of the semiconductor layer 14'. The first doped region may be formed by a process of doping an impurity. According to another embodiment of the present invention, after the first opening 16 is filled with polysilicon containing an impurity, a subsequent heat treatment may be performed to diffuse the impurity from the polysilicon to the first-side end of the semiconductor layer 14'. As a result, the first doped region may be formed in the first-side end of the semiconductor layer 14'. As for the first doped region, the first doped region SR shown in FIG. 1C may be referred to.

According to another embodiment of the present invention, before the vertical conductive line 23 is formed, a first ohmic contact coupled to the first-side end of the semiconductor layer 14' may be formed. The first ohmic contact may include a metal silicide. For example, a metal silicide may be formed by sequentially performing a process of depositing a metal layer and then performing an annealing process, and the metal layer remaining unreacted may be removed. The metal silicide may be formed by reacting the silicon of the semiconductor layer 14' with the metal layer.

Figure 16:
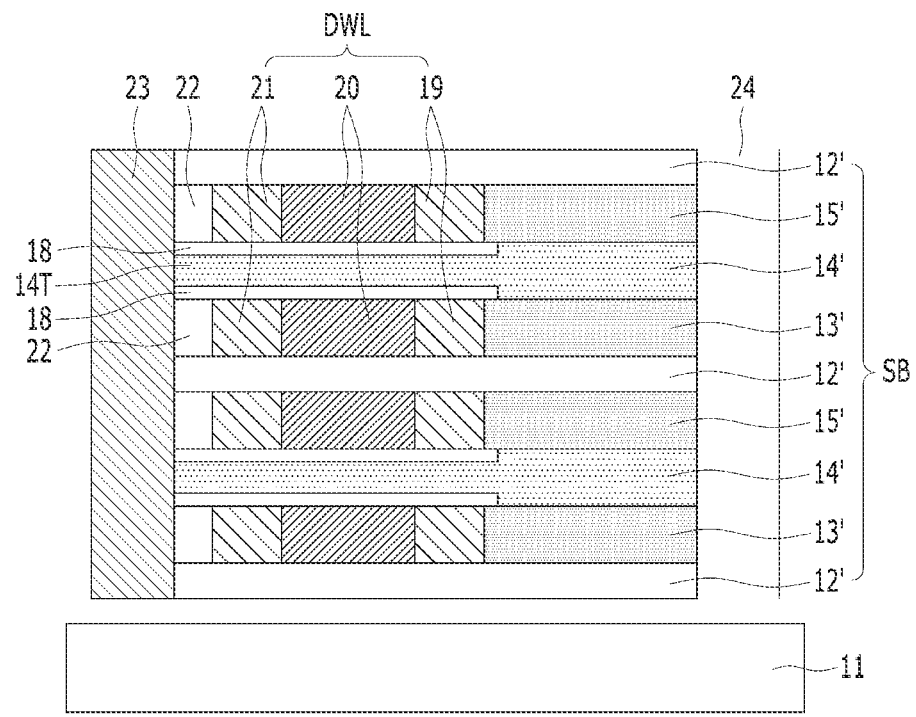

Referring to FIG. 16, a second opening 24 may be formed by etching another portion of the stack body SB. The second opening 24 may extend vertically from the surface of the lower structure 11.

Figure 17:
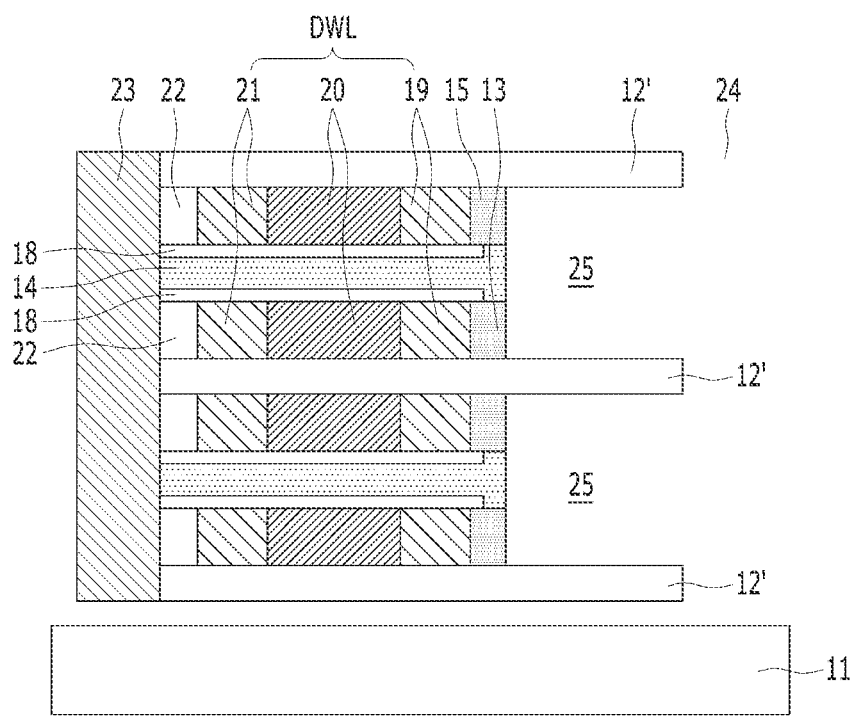

Referring to FIG. 17, first and second sacrificial layers 13' and and the semiconductor layer 14' may be selectively recessed through the second opening 24. As a result, wide openings 25 may be formed between the dielectric layers 12'. The semiconductor layer 14' including a thin portion 14T may remain as the lateral layer 14 which is represented by the reference numeral '14', and a second-side end of the lateral layer 14 may be exposed by a wide opening 25. Second capping layers 13 and 15 may be respectively formed on the side surfaces of the first low work function electrode 19 by the process of selectively recessing the first and second sacrificial layers 13' and 15'.

The lateral layer 14 may be thinner than the first low work function electrodes 19, the high work function electrodes 20, and/or the second low work function electrodes 21. The lateral layer 14 may be referred to as a thin-body active layer.

According to another embodiment of the present invention, after the wide openings 25 are formed, a second doped region may be formed in the second-side end of the lateral layer 14, The second doped region may be formed by a process of doping an impurity. According to another embodiment of the present invention, after the second opening 24 and the wide opening 25 are filled with polysilicon containing an impurity, the subsequent heat treatment may be performed to diffuse the impurity from the polysilicon to the second-side end of the lateral layer 14. As a result, a second doped region may be formed in the second-side end of the lateral layer 14, A channel may be defined between the first doped region and the second doped region. As for the first doped region, the channel, and the second doped region, the first doped region SR, the channel CH, and the second doped region DR of FIG. 1C may be referred to.

According to another embodiment of the present invention, a second ohmic contact coupled to the second-side end of the lateral layer 14 may be formed. The second ohmic contact may include a metal silicide. For example, a metal silicide may be formed by sequentially performing a process of depositing a metal layer and performing an annealing process, and the metal layer remaining unreacted may be removed. The metal silicide may be formed by reacting the silicon of the lateral layer 14 with the metal layer.

Figure 18:
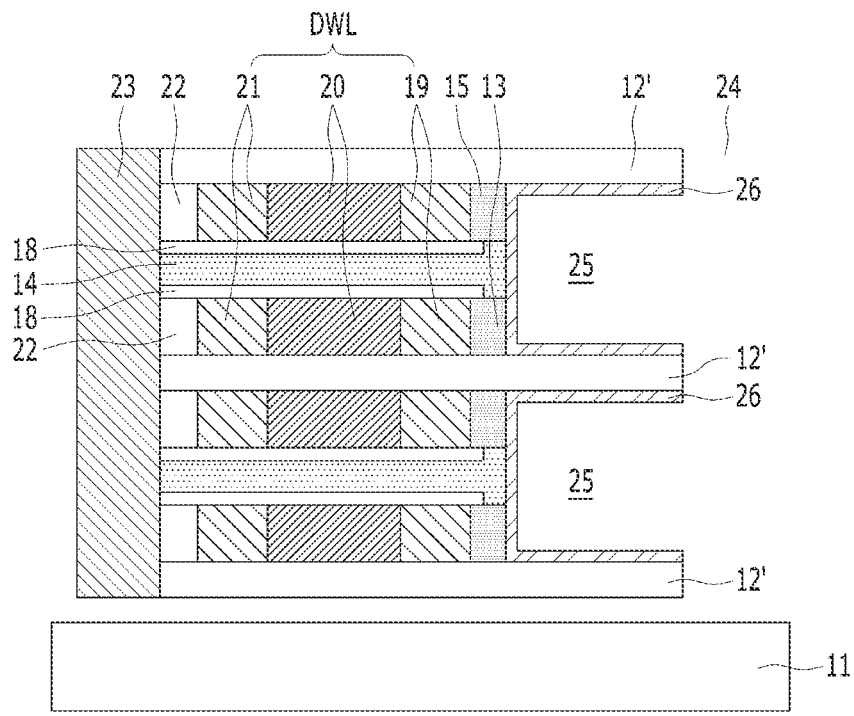

Referring to FIG. 18, a first electrode 26 contacting the second-side ends of the lateral layers 14 may be formed. To form the first electrode 26, a conductive material may be deposited and an etch-back process may be performed. The first electrode 26 may include titanium nitride. The first electrode 26 may have a laterally oriented cylindrical shape.

Figure 19:
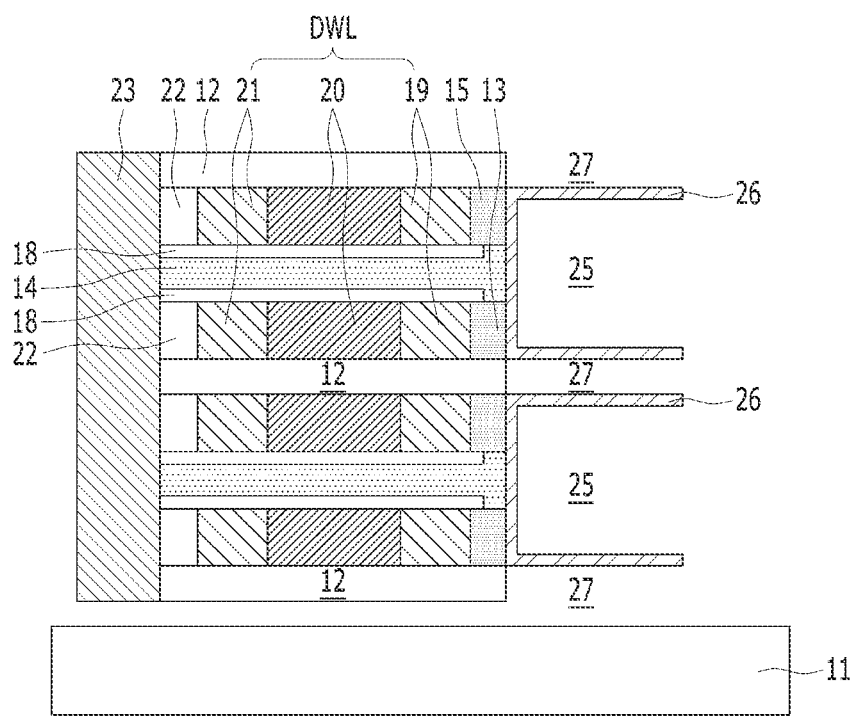

Referring to FIG. 19, the dielectric layers 12' may be partially recessed 27. Accordingly, the outer walls of the first electrodes 26 may be exposed. The remaining dielectric layers 12 may contact the lateral conductive line DWL. The remaining dielectric layers 12 may be referred to as cell isolation layers.

Figure 20:
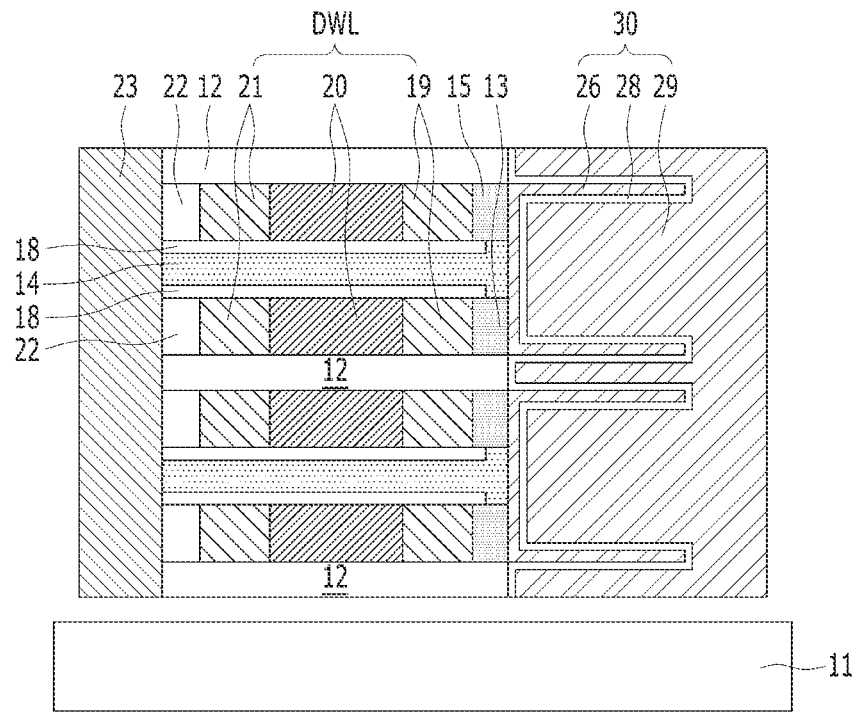

Referring to FIG. 20, a dielectric layer 28 and a second electrode 29 may be sequentially formed over the first electrodes 26. The first electrode 26, the dielectric layer 28, and the second electrode 29 may become a data storage element 30.

Figure 21:
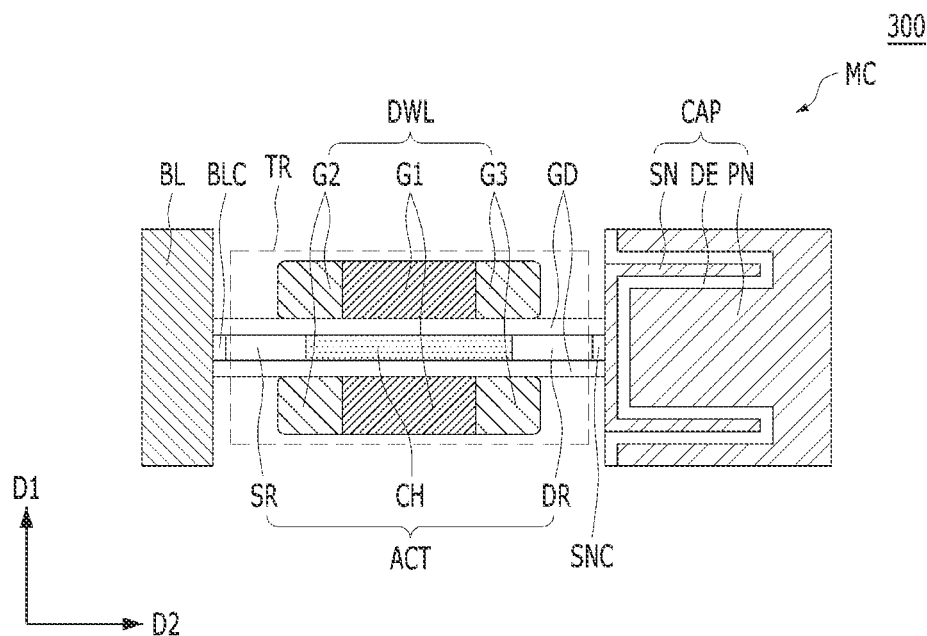
FIG. 21 is a schematic cross-sectional view illustrating a semiconductor device in accordance with still another embodiment of the present invention.

FIG. 21 is a schematic cross-sectional view illustrating a semiconductor device in accordance with another embodiment of the present invention.

Referring to FIG. 21, the semiconductor device 300 may include a memory cell MC, The memory cell MC may include a vertical conductive line BL, a switching element TR, and a data storage element CAP, The data storage element CAP may include a first electrode SN, a dielectric layer DE, and a second electrode PN. The switching element TR may include a lateral layer ACT and a lateral conductive line DWL. The lateral layer ACT may include a first doped region SR, a channel CH, and a second doped region DR. The lateral conductive line DWL may include a pair of first work function electrodes G1, a pair of second work function electrodes G2, and a pair of third work function electrodes G3. The second work function electrodes G2 may be adjacent to the vertical conductive line BL, and the third work function electrodes G3 may be adjacent to the data storage element CAP. The first work function electrodes G1 may overlap with the channel CH.

A first contact node BLC may be formed between the first doped region SR and the vertical conductive line BL, A second contact node SNC may be formed between the second doped region DR and the first electrode SN of the data storage element CAP. Each of the first and second contact nodes BLC and SNC may include polysilicon which is doped with an N-type dopant. The first and second doped regions SR and DR may include dopants diffused from the first and second contact nodes BLC and SNC.

According to another embodiment of the present invention, a first ohmic contact may be formed between the first contact node BLC and the vertical conductive line BL, A second ohmic contact may be formed between the second contact node SNC and the first electrode SN. Each of the first and second ohmic contacts may include a metal silicide.

Figure 22:
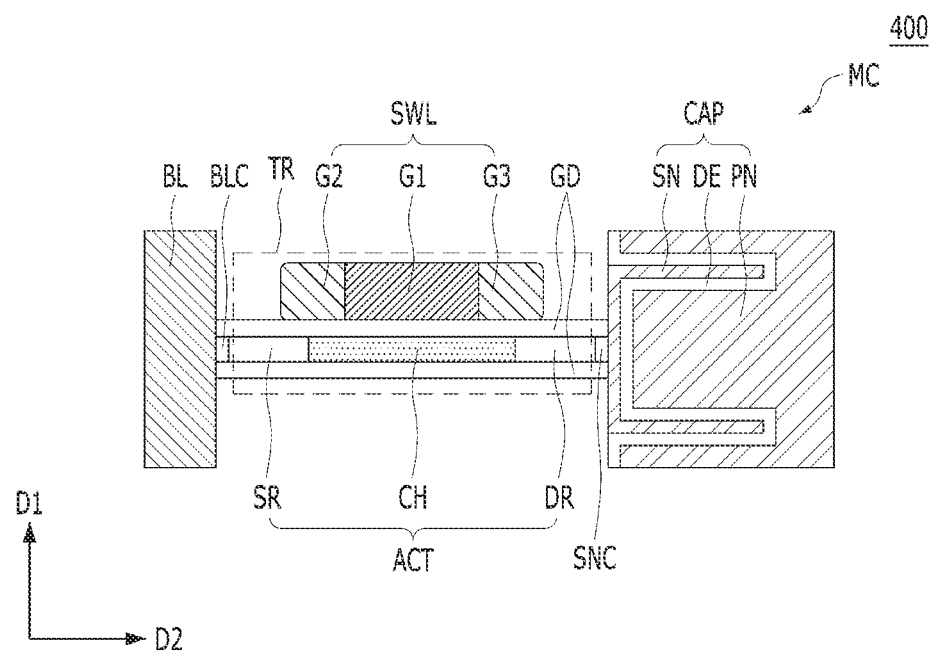
FIG. 22 is a schematic cross-sectional view illustrating a semiconductor device in accordance with another embodiment of the present invention.

FIG. 22 is a schematic cross-sectional view illustrating a semiconductor device in accordance with another embodiment of the present invention.

Referring to FIG. 22, the semiconductor device 400 may include a memory cell MC. The memory cell MC may include a vertical conductive line BL, a switching element TR, and a data storage element CAP. The data storage element CAP may include a first electrode SN, a dielectric layer DE, and a second electrode PN. The switching element TR may include a lateral layer ACT and a single lateral conductive line SWL. The lateral layer ACT may include a first doped region SR, a channel CH, and a second doped region DR. The single lateral conductive line SWL may be disposed over the upper surface of the lateral layer ACT. The single lateral conductive line SWL may include a first work function electrode G1, a second work function electrode G2, and a third work function electrode G3. The second work function electrode G2 may be adjacent to the vertical conductive line BL, and the third work function electrode G3 may be adjacent to the data storage element CAP. The first work function electrode G1 may overlap with the channel CH.

A first contact node BLC may be formed between the first doped region SR and the vertical conductive line BL. A second contact node SNC may be formed between the second doped region DR and the first electrode SN of the data storage element, Each of the first and second contact nodes BLC and SNC may include polysilicon which is doped with an N-type dopant. The first and second doped regions SR and DR may include dopants diffused from the first and second contact nodes BLC and SNC.

According to another embodiment of the present invention, a first ohmic contact may be formed between the first contact node BLC and the vertical conductive line BL, A second ohmic contact may be formed between the second contact node SNC and the first electrode SN. Each of the first and second ohmic contacts may include a metal silicide.

According to one embodiment of the present invention, memory cells may be highly integrated by forming a word line having a triple electrode structure.

According to one embodiment of the present invention, leakage current may be reduced by forming a word line having a triple electrode structure, thereby securing refresh characteristics, which makes it possible to realize low power consumption.

The technology according to one embodiment of the present invention may be relatively advantageous for increasing an electric field which is generated when the thickness of a channel is decreased for high density device integration, and thus it may be realized by a high number of stacking stages.

According to one embodiment of the present invention, it is possible to realize a low power consumption and a high density integration of three-dimensional (3D) memory cells.

While the present invention has been described with respect to the specific embodiments, it will be apparent to those skilled in the art that various changes and modifications may be made without departing from the spirit and scope of the invention as disclosed above,

What is claimed is:

1. A semiconductor device comprising:
 a lateral layer spaced apart from a lower structure and extending in a direction parallel to the lower structure;

a vertical conductive line extending in a direction perpendicular to the lower structure and coupled to a first-side end of the lateral layer;

a data storage element coupled to a second-side end of the latera layer; and a lateral conductive line extending in a direction crossing the lateral layer, wherein the lateral conductive line includes:

a first work function electrode;

a second work function electrode disposed adjacent to the vertical conductive line and having a lower work function than the first work function electrode; and a third work function electrode disposed adjacent to the data storage dement and having a lower work function than the first work function electrode.

2. The semiconductor device of claim 1, wherein the second and third work function electrodes have a work function which is lower than a mid-gap work function of silicon, and the first work function electrode has a work function which is higher than the mid-gap work function of silicon.

3. The semiconductor device of claim 1, wherein the second and third work function electrodes include doped polysilicon which is doped with an N-type dopant.

4. The semiconductor device of claim 1, wherein the first work function electrode includes a metal-based material.

5. The semiconductor device of claim 1, wherein the first work function electrode includes a metal, a metal nitride, or a combination thereof.

6. The semiconductor device of claim 1, wherein the first work function electrode has a larger volume than the second and third work function electrodes.

7. The semiconductor device of claim 1, wherein each of the first, second and third work function electrodes vertically overlaps with the lateral layer.

8. The semiconductor device of claim 1, wherein the first work function electrode and the second work function electrode have the same work function.

9. The semiconductor device of claim 1, wherein the lateral layer has a thickness which is smaller than thicknesses of the first, second, and third work function electrodes.

10. The semiconductor device of claim 1, wherein the lateral layer includes a semiconductor material or an oxide semiconductor material.

11. The semiconductor device of claim 1, wherein the lateral layer includes monocrystalline silicon, polysilicon, germanium, silicon-germanium or IGZO (Indium Gallium Zinc Oxide).

12. The semiconductor device of claim 1, wherein the lateral layer includes:

a first doped region coupled to the vertical conductive line;

a second doped region coupled to the data storage element; and a channel between the first doped region and the second doped region.

13. The semiconductor device of claim 1, wherein the lateral conductive line includes:

a lateral conductive line of a double structure facing each other with the lateral layer interposed therebetween.

14. The semiconductor device of claim 1, wherein the data storage element includes a capacitor, the capacitor including a cylindrical first electrode, a second electrode and a dielectric layer, wherein the dielectric layer is disposed between the first electrode and the second electrode.

15. The semiconductor device of claim 1, further comprising:

a first contact node between the vertical conductive line and the first-side end of the lateral layer; and a second contact node between the data storage element and the second-side end of the lateral layer.

* * * * *